United States Patent
Mubaslat et al.

(10) Patent No.: US 7,391,335 B2
(45) Date of Patent: Jun. 24, 2008

(54) AEROSPACE LIGHT-EMITTING DIODE (LED)-BASED LIGHTS LIFE AND OPERATION MONITOR COMPENSATOR

(75) Inventors: Saed M. Mubaslat, Miamisburg, OH (US); Terence D. Kirkpatrick, Urbana, OH (US); Nicolo F. Machi, Marysville, OH (US)

(73) Assignee: Honeywell International, Inc., Morristown, NJ (US)

( * ) Notice: Subject to any disclaimer, the term of this patent is extended or adjusted under 35 U.S.C. 154(b) by 309 days.

(21) Appl. No.: 11/206,024

(22) Filed: Aug. 18, 2005

(65) Prior Publication Data

US 2007/0040696 A1 Feb. 22, 2007

(51) Int. Cl.
*G01R 31/24* (2006.01)
(52) U.S. Cl. .................. 340/657; 340/660; 340/664; 340/815.45; 315/224; 315/308; 324/523; 345/82
(58) Field of Classification Search ................ 340/657, 340/660, 664, 815.45; 315/224, 308; 324/523; 345/82
See application file for complete search history.

(56) References Cited

U.S. PATENT DOCUMENTS

| | | | | |
|---|---|---|---|---|
| 3,265,971 | A * | 8/1966 | Montone | 318/660 |
| 4,622,477 | A | 11/1986 | Uda | |
| 4,797,609 | A | 1/1989 | Yang | |
| 5,592,051 | A * | 1/1997 | Korkala | 315/210 |
| 6,147,617 | A * | 11/2000 | Kim | 340/664 |
| 6,350,978 | B1 | 2/2002 | Kasai | |
| 6,362,578 | B1 | 3/2002 | Swanson et al. | |
| 6,448,716 | B1 * | 9/2002 | Hutchison | 315/129 |
| 6,486,726 | B1 | 11/2002 | Worley, Sr. et al. | |
| 6,586,890 | B2 | 7/2003 | Min et al. | |
| 6,853,150 | B2 | 2/2005 | Clauberg et al. | |
| 6,888,383 | B1 | 5/2005 | Fairbanks | |
| 7,132,805 | B2 * | 11/2006 | Young | 315/308 |
| 2003/0122502 | A1 | 7/2003 | Clauberg et al. | |
| 2003/0123521 | A1 | 7/2003 | Luoma | |
| 2004/0004446 | A1 | 1/2004 | Lui | |
| 2004/0041620 | A1 | 3/2004 | D'Angelo et al. | |
| 2004/0150590 | A1 * | 8/2004 | Cok et al. | 345/76 |
| 2004/0155644 | A1 | 8/2004 | Stopa | |
| 2004/0164939 | A1 * | 8/2004 | Johnson et al. | 345/82 |
| 2004/0256625 | A1 | 12/2004 | Russell et al. | |
| 2005/0030267 | A1 * | 2/2005 | Tanghe et al. | 345/82 |
| 2005/0062481 | A1 | 3/2005 | Vaughn et al. | |
| 2005/0206529 | A1 * | 9/2005 | St.-Germain | 340/815.45 |
| 2005/0242822 | A1 * | 11/2005 | Kinger | 324/523 |

FOREIGN PATENT DOCUMENTS

JP 10-39836 2/1988
WO WO-02/093186 A1 11/2002

* cited by examiner

*Primary Examiner*—Davetta W. Goins
*Assistant Examiner*—Anne V. Lai
(74) *Attorney, Agent, or Firm*—Black Lowe and Graham PLLC (57) ABSTRACT

A system (10) and method for monitoring the operational life and/or performance of one or more light-emitting diodes (LEDs) (20) based on sensed parameters are disclosed. The remaining life of each LED may be predicted by counting the clock cycles during which the LED-based light is activated. LED current and/or temperature measurements may be used to control the clock signal and, thus, to compensate the predicted life value. Furthermore, operational characteristics of the LED-based light may be monitored based on LED current and/or voltage measurements. Such characteristics may include performance (e.g., intensity) and failure conditions (e.g., open or short circuits).

20 Claims, 6 Drawing Sheets

AEROSPACE LIGHT-EMITTING DIODE (LED)-BASED LIGHTS LIFE AND OPERATION MONITOR COMPENSATOR

FIELD OF THE INVENTION

The present invention is directed to monitoring the operational condition of light-emitting diode (LED)-based lighting devices and, more particularly, to sensing LED parameters affecting the operation of such devices.

BACKGROUND OF THE INVENTION

Light-emitting diodes (LED) are becoming increasingly used over other types of lights because of advantages in heat and power dissipation, as well as operational life. For example, LEDs are being used in various aerospace applications, including interior instrumentation lights of aircraft for providing flight control information to pilots, and exterior aircraft warning lights (e.g., anti-collision lights) for alerting others as to the aircraft's position and location.

In such flight-critical applications, the degradation or failure of LEDs that occurs over time is a concern. Without adequate monitoring of the operational health of such LEDs, the potential exists for unpredicted malfunctions. Such malfunctions may include overall failure (e.g., a short circuit or open circuit condition), or illumination at a level which is substantially below that dictated by flight regulations.

However, existing LED-based lights are mainly dependent on passive, open-loop control systems. Such control systems do not regulate the lights based on key factors that affect LED operation, e.g., current and diode junction temperature. Also, these previous lighting systems lack the "intelligence" to monitor the key LED parameters in order to estimate remaining operational life and predict future performance of the installed LEDs. In addition, such systems do not provide a way to test for failure conditions while the LEDs are turned off.

SUMMARY OF THE INVENTION

Exemplary embodiments of the present invention monitor operational life and other characteristics of an LED-based lighting device based on sensed parameters.

According to one aspect of the present invention, the operational life of an LED may be monitored by recording the amount of time during which the LED is in operation. In a particular aspect, measurements regarding the LED current and/or temperature may be used to compensate such monitoring.

In an exemplary embodiment, the LED's operational life may be monitored by producing a clock signal and recording the number of cycles produced by the clock signal when the LED is tuned on. In such an embodiment, a measured LED current may be used to compensate the operational life monitoring by determining the clock signal frequency based on the measured current. Alternatively, a measured LED temperature may be used to compensate the operational life monitoring by determining the clock signal frequency. In another alternative embodiment, both the measured LED current and temperature may be used for compensating the operational life monitoring.

According to another aspect of the present invention, an operational characteristic of an LED is monitored based on one or more measured electrical characteristics associated with the LED. The measured electrical characteristic may be the voltage across the LED terminals, or the current flowing through the LED.

In an exemplary embodiment, the measured characteristic may be used for testing the LED for a failure condition. For example, in a particular exemplary embodiment, failure condition testing may be performed when the LED is turned off. In such an embodiment, the measured LED current may be used to test for short circuit conditions. Alternatively, or in addition thereto, the measured voltage across the LED may be used to test for open circuit conditions.

Further aspects in the scope of applicability of the present invention will become apparent from the detailed description provided hereinafter. However, it should be understood that the detailed description and the specific embodiments therein, while disclosing exemplary embodiments of the invention, are provided for purposes of illustration only.

BRIEF DESCRIPTION OF THE DRAWINGS

A more complete understanding of the present invention will become apparent from the following description taken in conjunction with the accompanying drawings, in which the same reference numerals are used to refer to like elements, wherein.

DETAILED DESCRIPTION OF EXEMPLARY EMBODIMENTS

An exemplary embodiment of the present invention is directed to a system that monitors the operational life and/or performance of one or more LEDs installed in an LED-based lighting device. According to an exemplary embodiment, monitoring LED performance may include both measuring operational characteristics of an LED when it is activated (turned on), or testing for failure conditions when the LED is deactivated (turned off).

Such an LED-based lighting device may be designed for aerospace applications. For instance, the present invention may be used to monitor LEDs in flight-critical lighting systems, such as an aircraft's exterior warning lights (anti-collision lights, forward position lights, etc.) or interior instrumentation lights (e.g., indicators on the pilot's control console). In such applications, the LED-based lighting device may be powered by a "wild frequency" AC power supply in the aircraft. Alternatively, a DC power source (e.g., battery) may be installed in the aircraft to energize the LEDs in the lighting device.

Aspects of the present invention are particularly useful for flight-critical applications in order to help avoid unpredicted failures or significant degradations in the LED-based lights, which might cause the output intensity to dip below the requisite level during flight. However, the present invention is in no way limited to flight-critical applications. Various aspects and embodiments of the present invention described herein may be used for monitoring LEDs in non-critical aircraft lighting systems, such as the luminaires that provide general lighting for passengers and crew.

Furthermore, the present invention is not limited to aerospace lighting systems, or to any particular operating environment. Exemplary embodiments of the present invention may be used for monitoring different types of LED-based lights. Such applications may include, but are not limited to, automobile lights (brake lights, turn signals, etc.), traffic lights, electronic road signs, message boards with traffic information, and flashlights.

It is also contemplated that exemplary embodiments of the present invention may be used to monitor multiple LEDs installed within an LED-based lighting system. For instance, the LED-based light may include a plurality of LEDs arranged in a series array, in a series-parallel configuration, or in other electrical configurations in which multiple LEDs are clustered together.

An exemplary embodiment of the present invention contemplates a system in which components for monitoring LED(s) are built around the subsystem for controlling the power dissipation and light intensity of the in LED-based lighting system. Such an embodiment is illustrated in FIG. 1.

Figure 1:
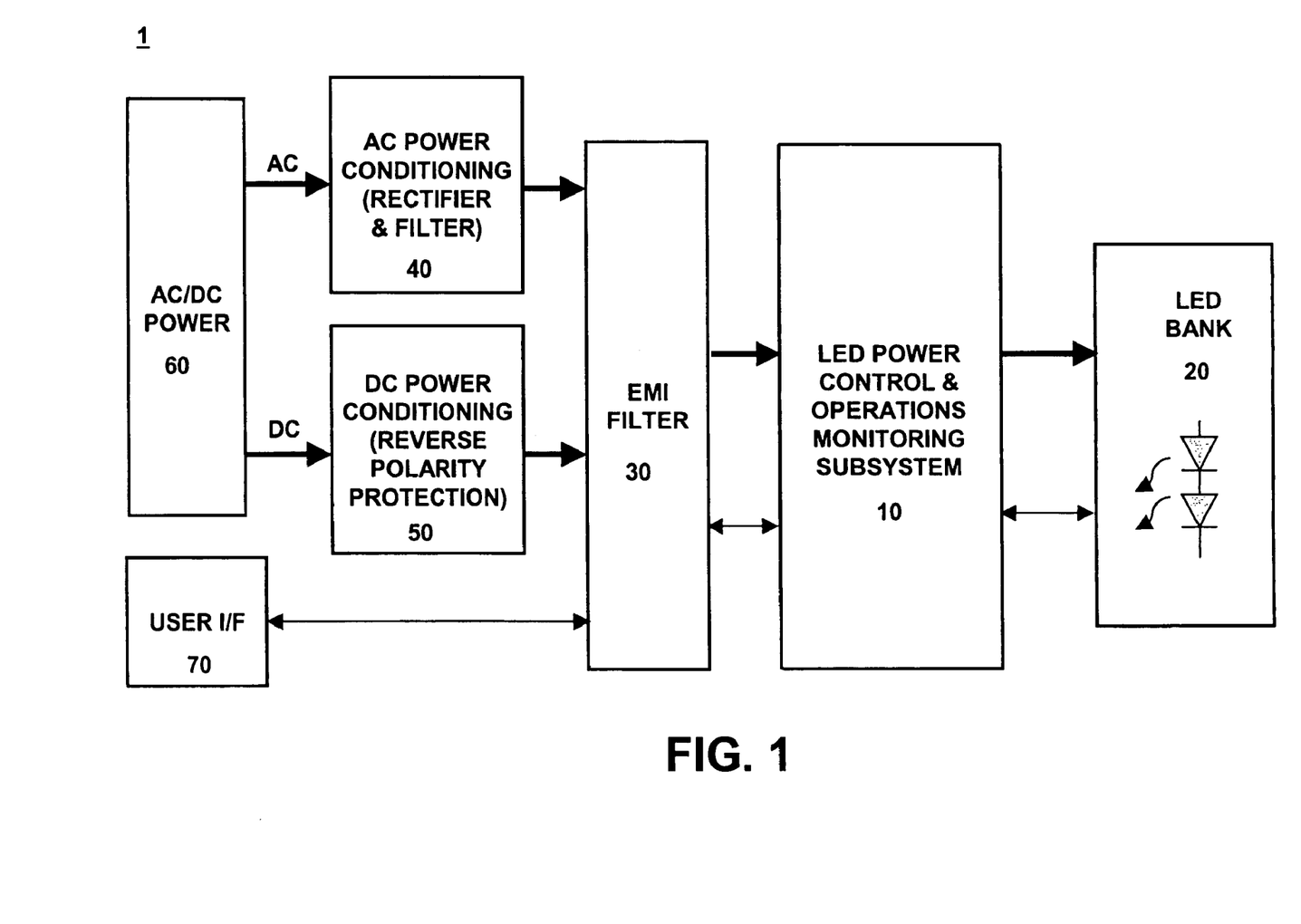
FIG. 1 illustrates a functional block diagram of a general system for controlling an LED-based lighting device, according to an exemplary embodiment of the present invention.

In FIG. 1, as well as in other figures described hereinbelow, two types of connectors are illustrated between the various functional blocks/components. For purposes of clarity, the connectors representing electrical pathways for delivering power are illustrated as thicker (bolder) lines, while the connectors representing pathways for other types of electrical signals (sensed parameters, data and control signals, etc.) are illustrated as thinner (less bold) lines.

FIG. 1 illustrates a functional block diagram of a general system 1 for controlling and supplying power to an LED-based lighting device. Referring to FIG. 1, the system 1 is responsible for controlling a bank of one or more LEDs 20, which are implemented in the lighting device. Subsystem 10 includes various components that work together to control the power dissipated in the LED bank 20, while also monitoring the operational life and/or performance of each LED. However, the LED power control and operations monitoring subsystem 10 does not receive power directly from the input power source 60.

As shown in FIG. 1, power source 60 may either supply AC or DC power. If AC power is supplied, the power may be received and processed by AC power conditioning components 40, e.g., including a filter and rectifier for conditioning the AC power. For instance, the AC power conditioning may be designed to receive and process a "wild frequency" AC power supply of an aircraft. Alternatively, if the power source 60 is a DC source (e.g., a battery), the power may be received by DC power conditioning components 50, e.g., which provide reverse polarity protection, among other functions.

FIG. 1 further shows that the power conditioned by either the AC (40) or DC (50) power conditioning components is received and processed by an electromagnetic interference (EMI) filtering device 30 before being sent to the LED power control and operations monitoring subsystem 10. Also, FIG. 1 shows that this subsystem 10 may also be coupled to a user interface 70 (via EMI filtering device 30), thereby allowing a user to input commands or instructions, e.g., to turn on and specify intensity levels for the LED-based lighting device. The user interface 70 may also be used for communicating information to the user regarding LED life and/or performance parameters being monitored.

According to an exemplary embodiment, controlling the intensity level and power dissipation of the LED-based lighting device is performed (by subsystem 10) by controlling the average current flowing across the LED bank 20. This may be achieved using either an analog linear approach, or a digital modulation technique.

According to the analog linear approach, a power dissipative device (not shown) may be connected in series with the LED bank 20. A net distribution of power exists among the LED bank 20 and power dissipative device (not shown). Thus, the current across the LED bank 20 is dependent on the impedance of the power dissipative device. Thus, the current is controllable by varying the impedance of the power dissipating device. For example, the power dissipative device may be an active device such as a bipolar transistor with varying "turn on" impedance. Alternatively, a passive element such as a variable power resistor or rheostat may be used.

However, in using this analog linear technique, the power dissipative device may cause a significant amount of power dissipation and generated heat. In order to avoid such inefficiencies, it may be more advantageous to use a digital modulation technique instead of the analog linear technique. Digital modulation techniques, which control the average current across the LED bank 20, include pulse width modulation (PWM) and pulse amplitude modulation (PAM).

Due to the advantages of using digital modulation technique, exemplary embodiments of the present invention are described below in which PWM and/or PAM techniques are implemented in the LED current control and operations monitoring subsystem 20. However, the underlying principles of the present invention apply equally as well in embodiments that utilize the analog linear approach. From the description of exemplary embodiments of the invention provided below, it will readily be apparent to those of ordinary skill in the art how to modify such embodiments to utilize analog linear control.

Figure 2:
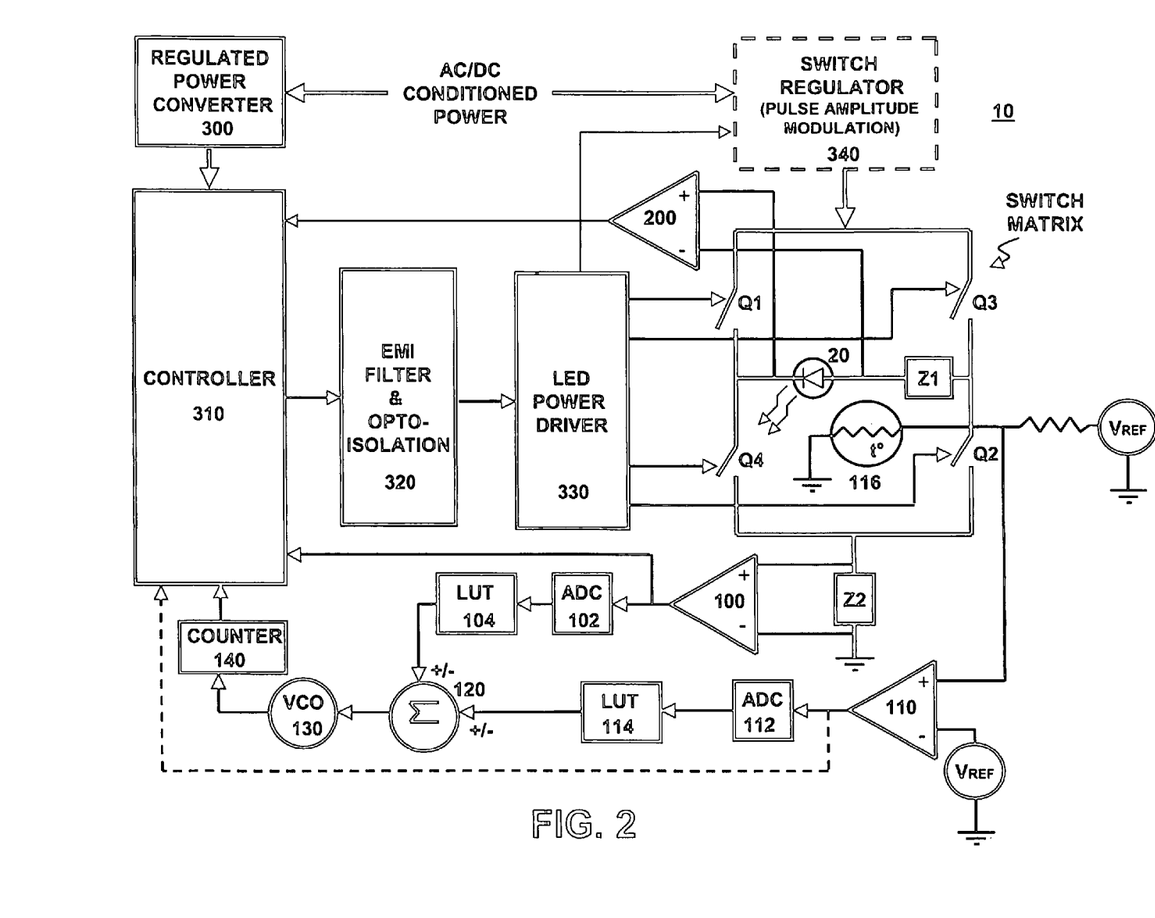
FIG. 2 illustrates a schematic diagram of an LED power control and operations monitoring subsystem encompassing several aspects of the present invention, according to an exemplary embodiment of the present invention.

FIG. 2 illustrates a schematic diagram of the LED power control and operations monitoring subsystem 20, which encompasses several aspects of the present invention, according to an exemplary embodiment.

In FIG. 2, the conditioned input power, which is received from the AC (40) or DC (50) power conditioning unit, is sent to the regulated power converter 300, which in turn supplies the local controller 310. According to an exemplary embodiment, this controller 310 may comprise a general microprocessor or a digital signal processor (DSP). The local controller 310 may further comprise, in addition to or instead of a microcontroller/DSP, any combination of hardware (digital or analog), software, and "firmware" as will be contemplated by those of ordinary skill in the art for performing the functions related to LED power control and operations monitoring, which will be described in further detail below.

Referring to FIG. 2, the local controller 310 is connected via the EMI filtering and opto-isolation circuitry 320 to the LED power driver circuitry 330. In view of the digital modulation techniques that are utilized, EMI filtering helps reduce audio- and radio-frequency emission that might be created by the switch mode power supply for the LED bank 20. The EMI filter circuitry may utilize both common mode and differential mode filtering as necessary to minimize emissions and susceptibility. The purpose of the opto-isolator circuitry 320 is to electrically isolate the local controller 310 from the LED power driver circuitry 330, thereby eliminating the risk of return voltage spikes.

As shown in FIG. 2, the conditioned input power is also sent to a "switch matrix," which is comprised of switching elements Q1-Q4 that are operable to provide "forward" and "reverse" electrical paths between the conditioned input power and the LED bank 20, depending on the state of the various switching elements Q1-Q4. According to an exemplary embodiment, each switching element may be a solid state switch, e.g., a bipolar transistor or a MOSFET, which is in an open state (turned off) or closed state (turned on) based on a corresponding on/off control signal from the LED power driver circuitry 330.

In particular, when switching elements Q3 and Q4 are placed in a closed state, and switching element Q1 and Q2 are in an open state, a forward electrical path is established from the conditioned input power, through the LED bank 20 (and current limiting impedance-based element Z1) to ground (via current sampling impedance-based element Z2). In other words, a forward current is provided to the LEDs in the LED bank 20.

Alternatively, a reverse electrical path is established from the conditioned input power, through the LED bank 20 to ground when switching elements Q1 and Q2 are closed, and switching elements Q3 and Q4 are open. When the reverse electrical path is established, it can be tested whether a reverse current is flowing through each LED in LED bank 20.

As described above, the LED power control and operations monitoring subsystem 10 may be configured to control power dissipation and light intensity of the LED bank 20 during operation according to a PWM and/or PAM technique. Referring back to FIG. 2, if the PAM technique is implemented, a switching regulator 340 may be disposed in the subsystem 10 to receive the conditioned input power and control its level before it is applied to the switch matrix. As shown in FIG. 2, the LED power driver circuitry 330 may include a connection to the switch regulator 340 for sending level control signals.

As will be understood by those of ordinary skill in the art, PAM controls the average current across the LED bank 20 by setting the amplitude of a series of regularly recurrent signal pulses sent to the LED bank 20. Thus, the switch regulator 340, also referred to as a DC/DC converter, sets the amplitude level of these pulses (while on/off control of switching elements Q3 and Q4 sets the pulse width).

PWM, on the other hand, controls the average current by varying the pulse width of the pulses sent to the LED bank 20 (based on the on/off control signals from the LED power driver circuitry 330). Thus, where PWM is exclusively used, the switch regulator 340 is not needed. Accordingly, the switch regulator 340 is illustrated as a dotted box to indicate that its presence is optional, depending on the type of digital modulation being used.

For purposes of simplicity, FIG. 2 illustrates the LED bank 20 as containing a single LED. However, the LED power driver circuitry 330 may adapt the average current based on the number of LEDs and the connection scheme (series, parallel, or a combination of both) in the LED bank 20, in order to avoid significant thermal losses. Specifically, the LED power driver circuitry's 330 outputs control signals that generate the necessary pulse amplitude or width, in order to supply the appropriate level of average current FIG. 2 further illustrates a "current sensing element" comprised of a differential amplifier 100 whose input terminals are connected to either end of a passive, impedance-based component Z2. This configuration allows the differential amplifier 100 to output a signal indicative of the voltage across element Z2. As illustrated, component Z2 impedes the flow of the current flowing through the LED bank 20 via the forward electrical path of switching elements Q3 and Q4. Thus, the voltage across component Z2 will be indicative of such current.

The output of the current sensing element (i.e., the output of differential amplifier 100) is sent to both the controller 310 and an analog to digital converter (ADC) 102. The output of the ADC 102 is connected to the input of a look-up table (LUT) 104. The LUT 104 may be implemented in a memory device, such as a flash memory or electrically erasable programmable read-only memory (EEPROM). The function of the LUT 104 is to convert the digitized output of the current sensing element into a digital compensation value, referred herein as the "current compensation signal," which is sent to a digital adding device 120.

FIG. 2 also illustrates a thermistor 116 disposed in the vicinity of the LED bank 20. Although a thermistor 116 is illustrated, other types of components whose electrical resistance varies in accordance with the temperature; e.g., a positive temperature coefficient (PTC) device may be disposed near the LED bank 20.

As shown in FIG. 2, the thermistor 116 is configured as part of a voltage divider connected to a reference voltage source $V_{REF}$. The output of this voltage divider is sent to one of the inputs of a differential amplifier 110. The differential amplifier's 110 other input receives another fixed reference voltage $V_{REF}$.

The arrangement of the thermistor 116-based voltage divider, fixed reference voltage source $V_{REF}$, and differential amplifier 110 together comprise "a temperature sensing element" for sensing the junction temperatures of the LEDs in LED bank 20. According to this arrangement, the output of the differential amplifier 110 will indicate any changes in resistance of the thermistor and, thus, any changes in the diode junction temperature associated with the LED bank 20.

However, the present invention is not limited to the type of temperature sensing element illustrated in FIG. 2, but covers other types of temperature sensors that will be contemplated by those of ordinary skill in the art.

The output of the differential amplifier 110 is also sent to the to the ADC 112 in order to digitize the sensed temperature. The output of ADC 112 is received by the LUT 114 in order to generate another digital compensation, which will be referred to herein as a "temperature compensation signal." This temperature compensation signal is sent to the other input of the digital adder device 120.

In FIG. 2, the output of the digital adder device 120 is connected to an input for controlling the frequency of a voltage controlled oscillator (VCO) 130. The output of the VCO 130 is a clocking device (i.e., it generates a clocking signal) for the counter 104. Thus, the output of the VCO 130 is connected to the clocking input of a counter 140. The counter 140 is designed to record the number of cycles in the VCO's 140 clocking signal, and send the results to the local controller 310.

FIG. 2 also illustrates a dotted line connecting the output of the differential amplifier 110 (i.e., the temperature sensing element output) directly to the controller 310. Specifically, this dotted line connection is illustrated in connection with an alternative embodiment of the present invention, in which the functionality of the ADCs 102 and 112, LUTs 104 and 114, digital adding device 120, VCO 130, and the counter 140 are incorporated directly into the local controller 310. The operative principles of each of the alternative embodiments will be described in more detail below with respect to the operative principles of FIG. 2.

FIG. 2 further shows a differential amplifier 200 whose input terminals are connected across the LED bank 20. As such, this differential amplifier 200 is configured to measure the voltage across the LED bank 20, and thus, may also be referred herein as a "voltage sensing element." As shown in FIG. 2, the output of the differential amplifier 200 is sent to the local controller 310. While the voltage sensing element is comprised of a differential amplifier 200 in the embodiment of FIG. 2, those of ordinary skill in the art will recognize that other types of devices or circuits may be implemented to measure a voltage across the LED bank 20.

The operative principles of exemplary embodiments of the present invention will be described below in connection with the various elements illustrated in FIG. 2. In addition, reference will be made to FIGS. 3-5 in order to illustrate various aspects and alternative embodiments associated with the present invention.

The operational life and intensity of an LED may be significantly affected by several key parameters during operation, including LED current, voltage, and diode-junction temperature. In other words, while manufacturers generally claim an extended life for the LED under predefined parameters (i.e., the "rated" life), the actual "application" life may be substantially different, based on the actual operating parameters for the LED in a real-world application. For instance, higher operating current generally shortens the LED's operational life, as does also higher operating temperature.

Thus, various aspects of the present invention are directed to using the LED power control and operations monitoring subsystem 10 to monitor these parameters for the LEDs in LED bank 20. Accordingly, the local controller 310 may be provided real-time sensing and feedback of these parameters. Using this information, the local controller 310 may be able to predict the remaining life in a particular LED, or the collective life remaining for the set or a subset of the LEDs in the LED bank 20.

Figure 3:
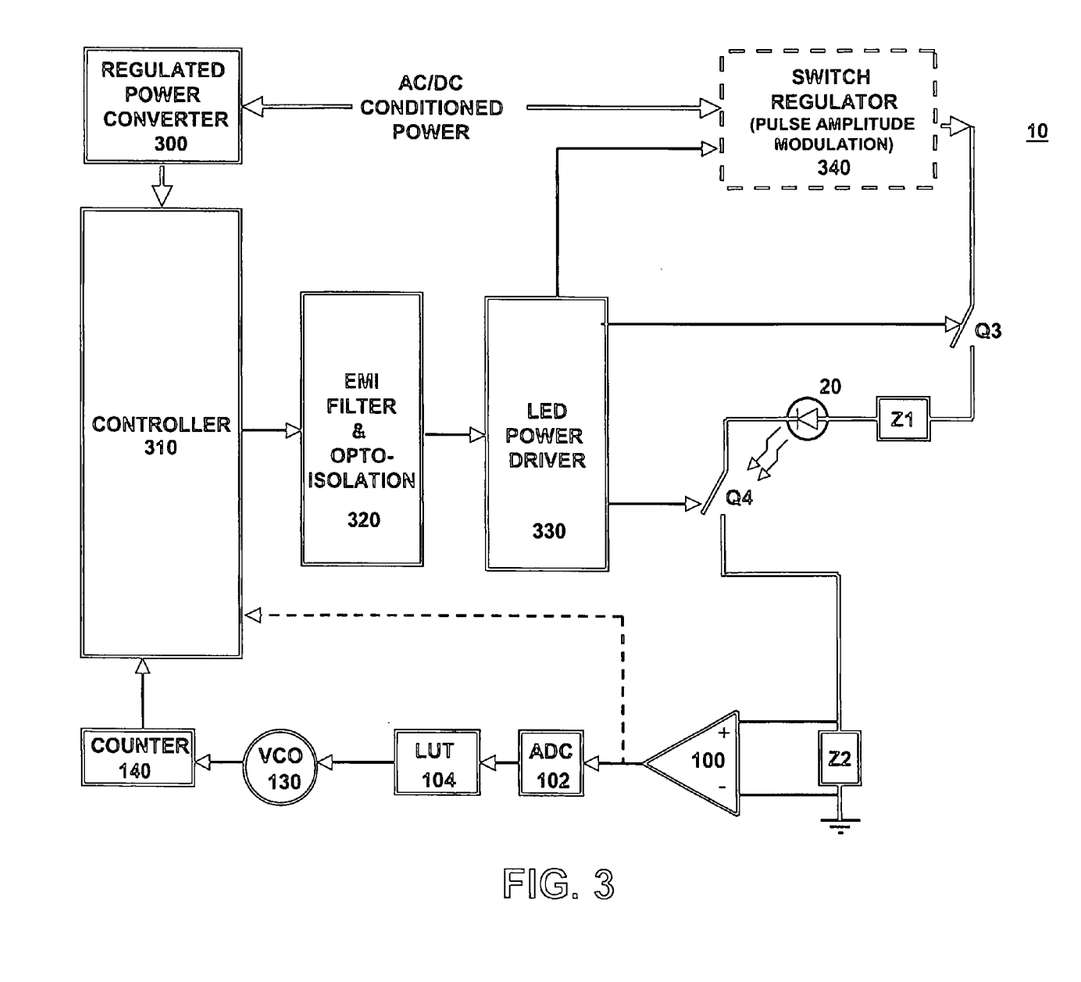
FIG. 3 illustrates a schematic diagram of an LED power control and operations monitoring system encompassing a particular aspect in which a measured LED current is used to compensate for operational life monitoring, according to an exemplary embodiment of the present invention.

According to a particular aspect of the present invention, the LED power control and operations monitoring subsystem 10 may be configured to monitor operational life of the LED based on a measured current. FIG. 3 is a schematic diagram illustrating particular components of the subsystem 10 (illustrated in FIG. 2) that encompass this particular aspect.

Referring to FIG. 3, the LED power driver circuitry 330 is configured to control the power supplied and dissipated by the LED bank 20, e.g., by PWM or PAM digital modulation techniques.

As described above in connection with FIG. 2, if the PAM technique is used, the LED power driver circuitry 330 may send a level control signal to the switch regulator 340 to control the amplitude of the signal pulses sent to the LED bank 20. Also, the LED power driver circuitry 330 will turn on the switching elements Q3 and Q4, via the respective on/off control signals, in order to place switching elements Q3 and Q4 in the closed state when the LEDs are turned on. The closed state of switching elements Q3 and Q4 provide a forward electrical path for the signal pulses from the switch regulator 340 to power the LED bank 20.

Alternatively, if the PWM technique is used, the switch regulator is not necessary. The LED power driver circuitry 330 uses the respective on/off control signals to control the open/closed states of switching elements Q3 and Q4, thereby controlling the pulse width of signals supplied by the conditioned input power to the LED bank 20.

Referring to FIG. 3, the purpose of the counter 140 is to record the amount of time (e.g., hours) during which the LED-based lighting device is activated or energized, based on an input clock signal. The recorded time may be sent to the local controller 310 for use in estimating the remaining operational life. However, as described above, higher levels of operating current tend to shorten an LED's operational life in comparison with lower levels. To compensate for such effects, the frequency of the clock signal may be compensated, i.e., accelerated or decelerated, based on a measured LED current.

Thus, in FIG. 3, the current sensing element generates a signal indicative of the current flowing through the LED bank 20 while the LEDs are activated. After this measured current signal is output from the digital amplifier 100, and digitized by ADC 102, the signal may be "scaled" by the LUT 104 in order to generate the current compensation signal. This current compensation signal may be a digital control word output by the LUT 104.

For instance, the LUT 104 may store data related to an empirically determined curve that associates different amounts of LED current with different levels of degradation. A higher degradation level may result in accelerated degradation while the LED is activated. Thus, if the output current compensation signal indicates a higher level of degradation, the clock signal frequency of the counter 140 should be accelerated.

Accordingly, the current compensation signal from the LUT 104 is used for controlling the frequency of the clocking signal produced by the VCO 130. Thus, the VCO 130 produces a compensated clocking signal, which determines the rate at which the counter 140 is incremented.

According to an exemplary embodiment, when the LED bank 20 is not in operation, there will be no current sensed by the current sensing element. Accordingly, the output of the differential amplifier 100 will indicate to the ADC 102 and LUT 104 that no current is measured. Accordingly, the LUT 104 will output a signal indicating that the LED bank 20 is not in operation, thereby causing VCO 130 to cease generating the clocking signal and, thus, cause the counter 140 to stop incrementing. Accordingly, the counter 140 is configured only to record the time that the LEDs are activated and operational. However, according to an alternative embodiment, the VCO 130 may be configured to produce a clock signal with very low frequency when the LED bank 20 is not in operation, e.g., to reflect that minimal degradation occurs to the LED when it is not in operation.

The counter 140 may be configured around a non-volatile memory (e.g., EEPROM or flash memory) for recording the count value associated with the LED bank 20. According to an exemplary embodiment, the recorded value in the counter 140 represents the amount of time each LED in the LED bank 20 has been in operation, thus far. The recorded value in the counter 140 may be used by the local controller 310 for monitoring the remaining operational life of the LED bank 20. Accordingly, the local controller 310 may function as a "monitoring device" in relation to the operational life of the LED bank 20.

For example, the local controller 310 may use the recorded count value in counter 140 to estimate how much operational life is left in each LED in the LED bank 20, based on the rated life of the LED. When the local controller 310 estimates that the remaining operational life is low, an alarm signal or notification may be sent to the user interface 70 (as shown in FIG. 1) to notify a user that replacement is necessary. Also, the local controller 310 may instruct the LED power driver circuitry 330 to adjust the amount of power delivered to the LED bank 20 to ensure that sufficient intensity is maintained. Those of ordinary skill in the art will recognize that there are other ways to monitor the operational life of the LED bank 20 based on the recorded value in the counter 140.

Although the counter 140 has been described above having an incrementing function, an alternative embodiment contemplates the use of a decrementing count function. For example, the counter 140 may initially be programmed with a value representing the rated life of an LED, and this value may be decremented in accordance with the compensated clock signal generated by the VCO 130.

Another alternative embodiment is contemplated, in which the local controller 310 internally performs the operations described above in connection with the ADC 102, LUT 104, VCO 130 and counter 140. In this embodiment, the local controller 310 receives the analog output of the current sensing element via an analog port, as illustrated by the dotted line in FIG. 3 connecting the differential amplifier 100 directly to the local controller 310. For example, the local controller 310 may be a microcontroller or DSP, which is programmed to digitize and scale the measured current, generate a compensated clock signal, and record the number of cycles in the clock signal.

Furthermore, although FIGS. 2 and 3 illustrate embodiments in which the life-counting operation is performed for one LED bank 20, the present invention is not thus limited. For instance, the LED-based lighting device may contain multiple LED banks 20, each holding one or more LEDs. Accordingly, the LED power control and operations monitoring subsystem 10 may contain duplicative elements as necessary for monitoring the operational life of each of the LED banks 20. E.g., for each LED bank 20, there may be a separate current sensing element connected to a separate set of components (e.g., ADC 102, LUT 104, and VCO 130) for recording the time that LED bank 20 has been in operation. Furthermore, the counter 140 may include multiple registers or memory locations for storing the count values associated with multiple LED banks 20. It will be readily apparent to those of ordinary skill in the art how to implement necessary modifications to accommodate multiple LED banks 20.

Figure 4:
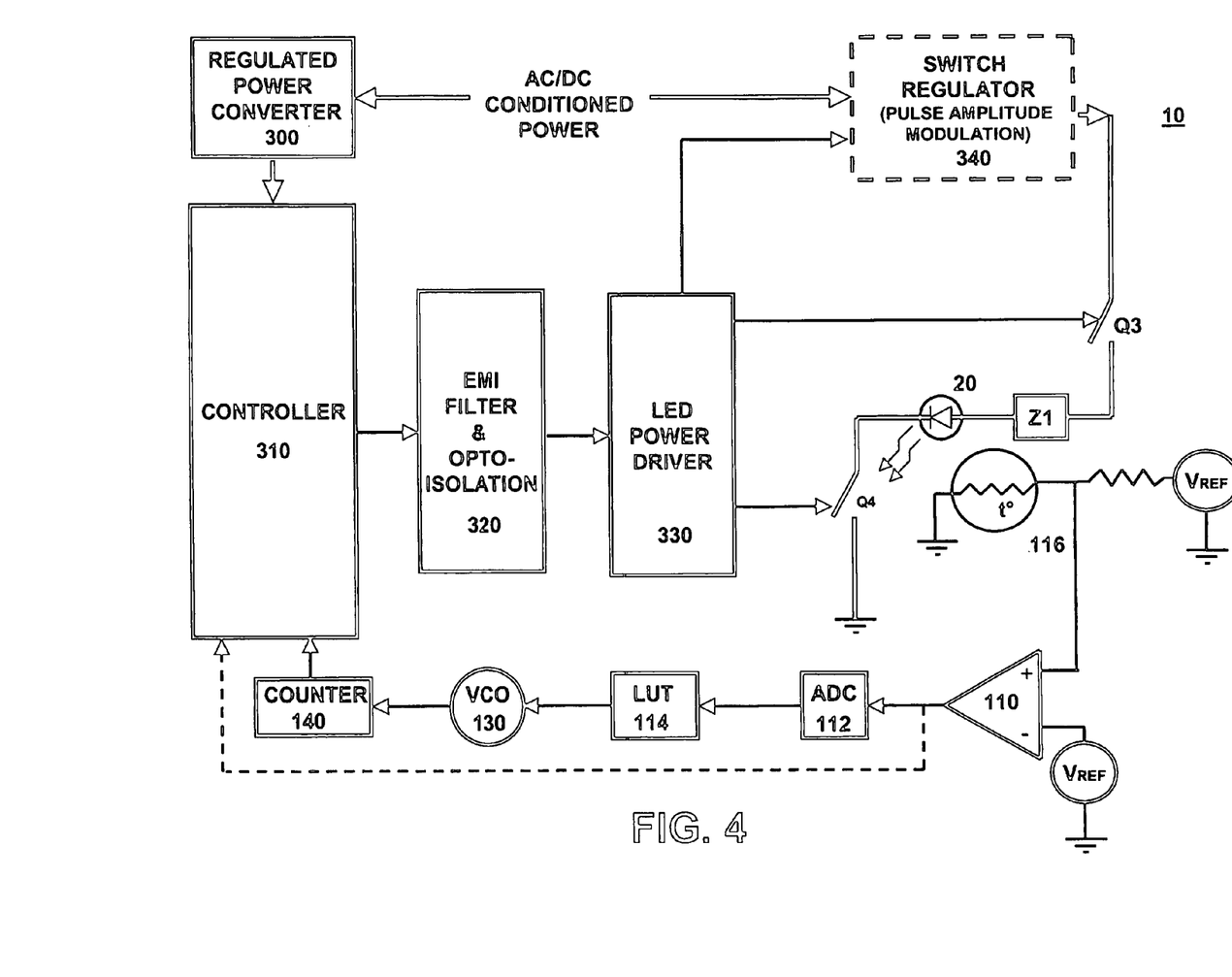
FIG. 4 illustrates a schematic diagram of an LED power control and operations monitoring system encompassing a particular aspect in which a measured LED temperature is used to compensate for operational life monitoring, according to an exemplary embodiment of the present invention.

According to another particular aspect of the present invention, as illustrated in FIG. 4, the counter 140 may be compensated based on the measured temperature, which is output by the temperature sensing element. As shown in FIG. 4, the clocking signal generated by VCO 130 may be adjusted based on the output of the differential amplifier 110, which is digitized (by ADC 112) and scaled (by LUT 114).

As illustrated in FIG. 4, the temperature sensing element includes a thermistor 116 disposed in the vicinity of the LED bank 20, or another similarly situated component whose electrical resistance varies in accordance with temperature. Accordingly, the output of the differential amplifier 112 (i.e., the output of the temperature sensing element) is indicative of the diode junction temperature associated with the LED bank 20. As shown in FIG. 4, this signal is sent to the ADC 112 and LUT 114 to be used for compensating the VCO's 130 clocking signal.

The principles of operation of the ADC 112 and LUT 114 are similar to those described above in relation to the differential amplifier 100, ADC 102, and LUT 104 of FIG. 3 and, thus, will not be repeated in detail here. It need only be mentioned that, similar to LED current levels, different diode junction temperature values may be associated with different levels of degradation for the LED based on empirical data. Thus, the LUT 114 may be configured to store data relating to such a curve in order to output an appropriate temperature compensation signal for accelerating or decelerating the clock signal.

In FIG. 4, the temperature compensation signal is output by the LUT 104 to the VCO 130 to control the frequency of the clocking signal, similar to the current compensation signal described above in connection with FIG. 3. The operation of the VCO 130, counter 140, and local controller 310 in FIG. 4 (as well as all other components not specifically discussed above in connection with FIG. 4) is similar to that described above in connection with the similarly-referenced components in FIGS. 2 and 3 and, thus, will not be repeated here.

Also, FIG. 4 further shows a dotted line connecting the output of the digital amplifier 110 directly to the local controller 310. Similar to the embodiment of FIG. 3 described above, this dotted line illustrates that the functionality of the ADC 112, LUT 114, VCO 130, and counter 140 may alternatively be implemented in the local controller 310. For instance, the local controller 310 may be a microprocessor or DSP programmed with such functionality.

As such, the counter 140 in FIG. 4 records a count value representing the amount of time the LED bank 20 is in operation. Furthermore, the embodiment of FIG. 4 ensures that the recorded amount of time is compensated according to the sensed diode junction temperature, by altering the frequency of the VCO's 130 clock signal in accordance with the temperature compensation signal.

According to another particular aspect of the present invention, both the measured LED current and LED temperature may be used to compensate for operational life monitoring. An exemplary embodiment of this aspect is illustrated in the schematic diagram of FIG. 5.

Figure 5:
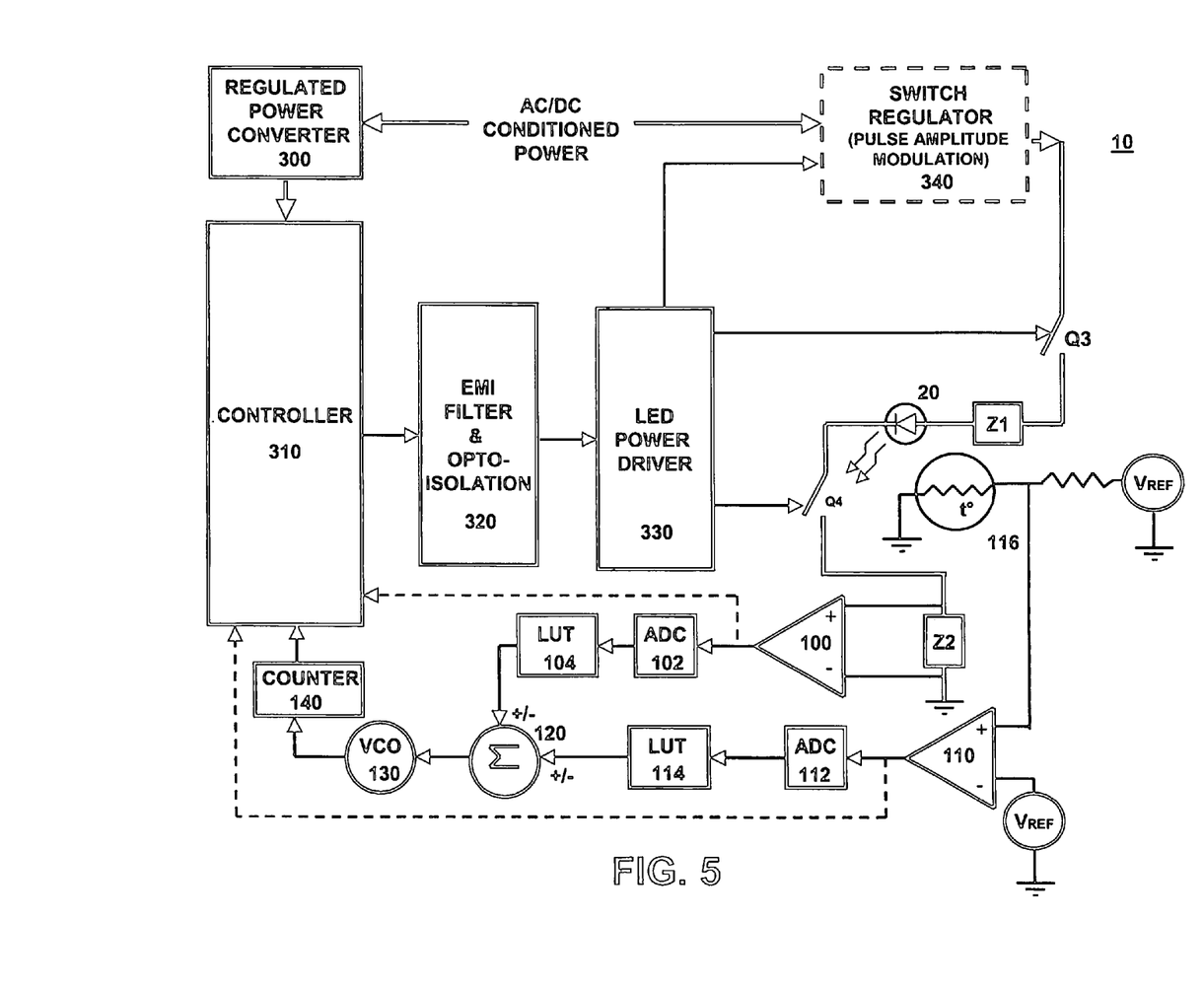
FIG. 5 illustrates a schematic diagram of an LED power control and operations monitoring system encompassing another particular aspect in which a measured LED current and temperature are used to compensate for operational life monitoring, according to an exemplary embodiment of the present invention.

As shown in FIG. 5, the LED power control and operations monitoring subsystem 10 includes both the current sensing element and the temperature sensing element. The sensed current and temperature signals output by the current and temperature sensing elements, respectively, are digitized (by ADCs 102 and 112, respectively) and scaled (by LUTs 104 and 114, respectively), thereby generating both a current compensation signal and temperature compensation signal.

In FIG. 5, however, the current and temperature compensation signals are input to the digital adder device 120. The summed output of the digital adder device 120 is used for controlling the frequency of the VCO 130. As such, both the sensed LED current and LED temperature may be used to compensate the counter value recorded in the counter 140 and, thus, the monitored operational life of the LED bank 20.

It will be readily apparent that the operation of those components not specifically mentioned above in connection FIG. 5 are similar to that described above in connection with FIGS. 2-4 and, thus, need not be discussed again here. Furthermore, the dotted line connecting the outputs of the current and temperature sensing elements to the local controller 310 further indicate that, according to an alternative embodiment, the functionality associated with the ADCs 102 and 112, the LUTs 104 and 114, the digital adder device 120, the VCO 130 and the counter 140 may be integrated in the local controller 310.

According to another aspect of the present invention, an operational characteristic of the LED bank 20 may be monitored based on measured electrical characteristics associated with the one or more LEDs contained therein. For instance, the sensed voltage across the terminals of the LED or LED bank 20 and/or the sensed current flowing therethrough may be used to monitor various operational characteristics.

In an exemplary embodiment, such measurements may be obtained while the LED bank 20 is turned on, in order to monitor operational characteristics such as LED output intensity. If such measurements determine that the output intensity is too low (based on aviation regulations, etc.), the local controller 310 may determine that a failure condition exists, and generate an alarm signal (e.g., to be sent to the user interface 70).

According to another exemplary embodiment, the LED voltage and current measurements may also be used to test for certain types of failure conditions when the LED bank 20 is turned off. For instance, such testing may determine whether a reverse current will flow through the LED bank 20 in response to a test signal, in order to detect whether a short circuit condition exists. Also, voltage measurements may be taken while the test signal is applied to detect the presence of an open circuit condition within the LED bank 20.

The LED voltage and current measurements may even be used to indirectly monitor diode junction temperature while the LED bank 20 is activated, at known environmental conditions.

Figure 6:
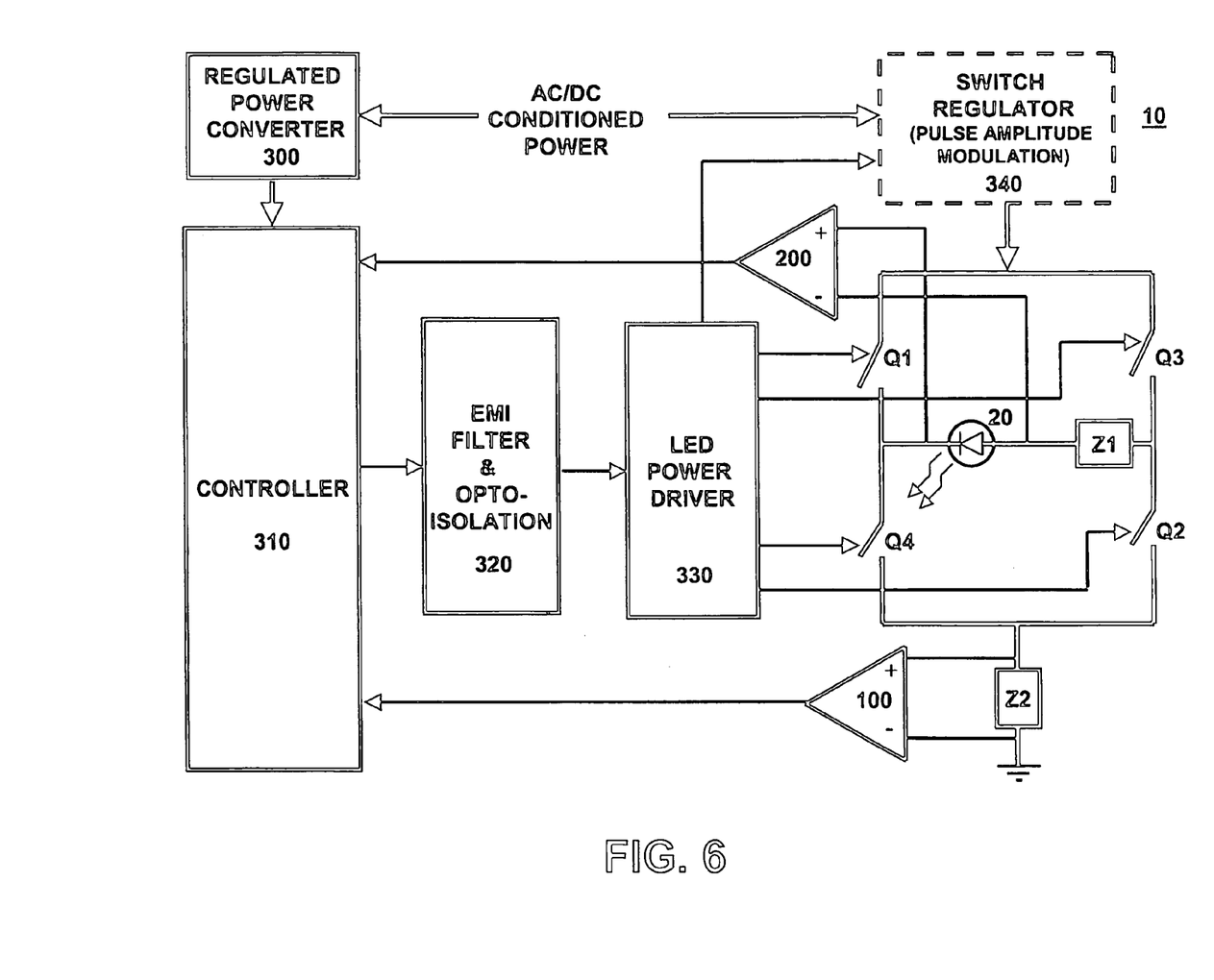
FIG. 6 illustrates a schematic diagram of an LED power control and operations monitoring system encompassing particular aspects in which operational characteristics of the LED are monitored and tested, according to an exemplary embodiment of the present invention.

FIG. 6 includes a schematic diagram of various components in the LED power control and operations monitoring subsystem 10 (as illustrated in FIG. 2) encompassing particular aspects in which operational characteristics and failure conditions of the LED bank 20 are monitored and tested, according to an exemplary embodiment.

As shown in FIG. 6, the output of the current sensing element (i.e., the output of differential amplifier 100) is sent directly to an analog port of the local controller 310 to illustrate that measurements of the LED current may be used to directly monitor operational characteristics of the LED bank 20. Furthermore, FIG. 6 shows that the output of the voltage sensing element described above in connection with FIG. 2 (i.e., the output of the differential amplifier 200) is sent to another analog port of the local controller 310. This shows that the local controller 310 may use LED voltage measurements to monitor the operational characteristics of the LED bank 20.

Consider the situation where the LED-based light is turned on. As described above in connection with FIG. 2, the LED power control circuitry 330 controls the switching elements Q3 and Q4 to alternate between open and closed states in order to supply pulses to the LED bank 20. Specifically, for the durations that Q3 and Q4 are closed, the forward electrical path is provided for the conditioned input power signal to propagate through the LED bank 20 to ground. By varying either the width (on/off duration of Q3 and Q4, according to PWM) or the amplitude (the output level of switching regulator 340, according to PAM), the LED power driver circuitry 330 attempts to control the average current in order to achieve a particular intensity level for the LED bank 20.

However, the performance of one or more LEDs in the LED bank 20 may deviate from the expected level of operation, e.g., due to, degradation, failure, or the operating environment. To compensate for such performance deviations, the LED power driver circuitry 330 may need to adjust the amount of current to the LED bank 20 to achieve the necessary intensity. Thus, in an exemplary embodiment, the local controller 310 receives real-time feedback regarding the intensity level of the LED bank 20.

In particular, LED parameters such as the forward voltage and forward current are generally indicative of the operative condition of an LED. For instance, as will be readily apparent to those of ordinary skill in the art, voltage and current measurements may be used for determining the intensity level. Accordingly, by receiving real-time feedback as to the measured voltage and current while the LED bank 20 is turned on, the local controller 310 can monitor the intensity level and control the LED power driver circuitry 330 to, e.g., increase the supplied current to compensate for degraded performance of the LED bank 20. It will be within the level of ordinary skill in the art to program or configure the local controller 310 to perform such control functions. In addition, the local controller 310 can notify the user via user interface 70 of the deviated performance. For instance, the local controller 310 may treat a significant deviation in performance as a failure condition, and generate an alarm signal accordingly. This may be appropriate when the LED bank 20 is unable to achieve predetermined levels of intensity (e.g., as specified by regulation).

Also, the LED current and voltage measurements may alert the local controller 310 regarding a condition causing the complete failure of one or more LEDs, while the LED bank 20 is in operation. For instance, when a short circuit condition occurs in connection with an LED, the sensed voltage will decrease to substantially zero, while the current flowing through the LED increases. On the other hand, when an open circuit condition occurs, the voltage will increase to the supplied voltage level, and no current will flow through the LED. Accordingly, the local controller 310 may use the sensed signals from the voltage and current sensing elements to continuously monitor for such failures. If a failure condition is detected, the local controller 310 may generate an alarm signal to notify the user via the user interface 70.

However, according to another aspect of the present invention, the local controller 310 may monitor for open and short circuit failure conditions even when the LED bank 20 is turned off. Such an embodiment contemplates the use of the entire switch matrix (switching elements Q1-Q4), as illustrated in FIG. 6. Specifically, when the LED bank 20 is turned off, the switching elements Q3 and Q4 are both in the open state (i.e., turned off) and, thus, the forward electrical path of the switch matrix is inhibited. During this time a test signal, i.e., a reverse pulse signal, may be applied to the LED bank 20 by momentarily turning on switching elements Q1 and Q2, thereby providing a reverse electrical path from the conditioned input power through the impedance-based element Z1, LED bank 20 (in the "reverse" direction), and impedance-based element Z2 to ground.

In response to the reverse test pulse, the current sensing element may detect whether a reverse current is flowing through the LED bank 20. Likewise, the voltage sensing element may measure the voltage applied across the LED bank 20 at this time. If the LED bank 20 is in normal operative condition, the current sensing element should not measure any reverse current flowing through, and the voltage across the LED bank 210 should correspond to the supply voltage.

However, a short circuit condition in the LED bank 20 may be detected by the local controller 310 when the current sensing device detects a reverse current flowing through the LED bank 20 as a result of the test signal (i.e., reverse pulse). Furthermore, if a short occurs, the voltage sensing element will detect an LED voltage of substantially zero.

On the other hand, an open circuit condition may be detected by the local controller 310 when the measured LED voltage corresponds to the level of the supplied pulse (with opposite polarity). Furthermore, when an open circuit condition occurs, no current should be detected by the current sensing element.

According to an exemplary embodiment, the LED power driver circuitry 330 may generate the reverse pulse test signals periodically while the LED bank 20 is turned off, allowing for a continuous monitoring of the short and open circuit conditions. Accordingly, exemplary embodiments of the present invention, as illustrated in FIG. 6, allow for continuous monitoring of the operative condition of LEDs regardless of whether they are activated or turned off.

According to another aspect of the present invention, the LED voltage and current measurements may also be used to indirectly sense an LED junction temperature while the LED bank 20 is tuned on or off under known environmental conditions. For instance, while the LED bank 20 is activated, the local controller 20 may correlate the forward current and voltage measurements to LED junction temperature values, e.g., based on an empirically determined curve. When the LED bank 20 is deactivated, the local controller 310 may similarly correlate the reverse current and voltage measurements, which are obtained as the result of applying a reverse pulse test, to LED junction temperature values based on empirical data.

As shown in FIG. 2, it is possible to incorporate one or more of the aspects described above in connection with FIGS. 3-6 in one overall embodiment of the LED power control and operations monitoring subsystem 10. Specifically, FIG. 2 shows an exemplary embodiment where the output of the current sensing element and/or the temperature sensing element may be used to compensate for the operational life parameters recorded by the counter 140. Also, in the embodiment of FIG. 2, measurements obtained by the voltage sensing element and/or the current sensing element may be fed to the local controller 310 in order to monitor operational conditions and failure conditions when the LED bank 20 is activated. Furthermore, the configuration of the switching matrix in FIG. 2, including switching elements Q1 and Q2, illustrates that a reverse pulse test may be performed for failure conditions while the LED bank 20 is not in operation (i.e., turned off).

However, it will be readily apparent to those of ordinary skill in the art that other circuit configuration may be used to implement one or more of the aspects of the present invention described above. Furthermore, various exemplary embodiments have been described above in connection with an alarm signal, which is generated by the local controller 310. Those of ordinary skill in the art will recognize that such an alarm signal may take the form of an audible and/or visual signal, e.g., at the user interface 70. Another possible variation is that, when the present invention is implemented in connection with an aircraft's exterior LED-based warning/position lights, the alarm signal may be viewable from the exterior of the aircraft.

Also, although exemplary embodiments describe the local controller 310 as generating the alarm signal, it is possible that other components will be capable of producing such signals. For instance, it is contemplated that the counter 140 may be integrated with an alarm that produces a warning signal when the recorded count value reaches a certain level, thereby indicating that the remaining operational life of the LED bank 20 is low.

Exemplary embodiments being thus described, it should be noted that any variations thereof may be made without departing from the spirit and scope of the present invention.

What is claimed is:

1. A system comprising: a control device adapted to turn on and control power dissipation in a light-emitting diode (LED);
a clocking device adapted to produce a clock signal, wherein a frequency of the clock signal is determined according to at least one of a measured current and measured temperature of a light emitting diode (LED);
a counter adapted to record a number of cycles in the clock signal produced while the LED is turned on; and
a monitoring device adapted to monitor an operational life of the LED based on the recorded number of cycles.

2. The system according to claim 1, wherein the clocking device is a voltage controlled oscillator (VCO) that receives a signal representative of the measured current and generates a frequency based on the received signal.

3. The system according to claim 1, further comprising:
a temperature sensing device adapted to measure a temperature in the vicinity of the LED,
wherein the frequency of the clock signal is determined based on the measured temperature.

4. The system according to claim 1, further comprising:
a current sensing device adapted to measure current flowing through the LED,
wherein the frequency of the clock signal is determined based on the measured current.

5. The system according to claim 4, further comprising:
a passive component impeding the current flowing through the LED,
wherein the current sensing device measures the voltage across the passive component.

6. The system according to claim 5, wherein the current sensing device comprises a differential amplifier.

7. The system according to claim 5, farther comprising:
a temperature sensing device adapted to measure a temperature in the vicinity of the LED,
wherein the frequency of the clock signal is determined based on both the measured current and the measured temperature.

8. The system according to claim 7, further comprising:
a thermistor disposed in the vicinity of the LED,
wherein the temperature sensing device's output reflects changes in resistance of the thermistor.

9. The system according to claim 8, wherein
the thermistor is part of a voltage divider,
the temperature sensing device further comprises a differential amplifier, and
the voltage divider is operably connected to an input of the differential amplifier.

10. The system according to claim 7, further comprising:
a voltage sensing device adapted to measure voltage across the LED,
wherein the temperature sensing device is adapted to compare the measured voltage and measured current to predetermined values, the predetermined values being correlated to diode junction temperatures of the LED.

11. The system according to claim 5, wherein the monitoring device is further adapted to:
receive a signal from the current sensing device indicative of the measured current;
use the received signal to test for a reverse current flowing through the LED when the LED is Wined off; and
generate an alarm signal in response to detecting the reverse current, the alarm signal indicating a short circuit condition for the LED.

12. The system according to claim 4, further comprising:
a voltage sensing device adapted to measure voltage across the LED,
wherein the monitoring device is further adapted to monitor operational characteristics of the LED based on the measured voltage.

13. The system according to claim 12, wherein the monitoring device is further adapted to use at least one of the measured voltage and measured current to test the LED for a failure condition when the LED is turned off.

14. A system comprising:
a control device adapted to turn on and off, and control power dissipation in, a light-emitting diode (LED);
a sensing device adapted to measure an electrical characteristic of a light-emitting diode (LED);
a monitoring device adapted to use the measured electrical characteristic to test the LED for a failure condition while the LED is set at a turned-off state by the control device,
wherein the measured electrical characteristic is at least one of a voltage across the LED and a current flowing through the LED, and
wherein the monitoring device detects the failure condition if the testing of the LED indicates one of the following has occurred:
while the LED is set at the turned-off state by the control device, a measured voltage across the LED corresponds to an open circuit condition, and
while the LED is set at the turned-off state by the control device, a current is detected flowing through the LED reverse to the direction of current flow for turning on the LED.

15. The system according to claim 14, wherein
the sensing device is a current sensing device, from which the monitoring device receives a signal indicative of the measured current flowing through the LED, and
the monitoring device is adapted to use the received signal to test for a reverse current flowing through the LED, which is indicative of a short circuit condition.

16. The system according to claim 15, further comprising:
a voltage sensing device adapted to measure a voltage across the LED, from which the monitoring device receives a signal indicative of the measured voltage,
wherein the monitoring device is adapted to use the measured voltage to test the LED for an open circuit condition.

17. The system according to claim 14, further comprising:
a switch matrix operable to:
turn on the LED by providing a forward electrical path between a power supply and the LED;
turn off the LED by inhibiting the forward electrical path; and
apply a test signal to the LED, while the LED is turned off, by providing a reverse electrical path between the power supply and the LED,
wherein the monitoring device tests the LED for the failure condition by analyzing the measured electrical characteristic in response to the test signal being applied to the LED.

18. The system according to claim 17, wherein the test signal is applied periodically while the LED is turned off, thereby allowing the monitoring device to periodically test the LED for the failure condition.

19. The system according to claim 14, further comprising:
a clocking device adapted to produce a clock signal, wherein a frequency of the clock signal is determined according to at least one of a measured current and measured temperature of a light emitting diode (LED); and
a counter adapted to record a number of cycles in the clock signal produced while the LED is turned on.

20. A method comprising:
using sensors to:
measure current flowing through a light-emitting diode (LED),
measure voltage across the light-emitting diode, and
measure a temperature in the vicinity of the LED;
producing a clock signal whose frequency is determined according to at least one of the measured current and the measured temperature;
recording the number of cycles in the clock signal while the LED is turned on, and monitoring an operational life of the LED based on the recorded number of cycles;
and testing the LED for a failure condition while the LED is turned off based on at least one of the measured current and measured voltage.

* * * * *

UNITED STATES PATENT AND TRADEMARK OFFICE
CERTIFICATE OF CORRECTION

PATENT NO. : 7,391,335 B2
APPLICATION NO. : 11/206024
DATED : June 24, 2008
INVENTOR(S) : Mubaslat et al.

It is certified that error appears in the above-identified patent and that said Letters Patent is hereby corrected as shown below:

Column 14, Line 24, "farther" should be --further--.

Column 14, Line 52, "Wined" should be --turned--.

Signed and Sealed this

Thirtieth Day of September, 2008

JON W. DUDAS
*Director of the United States Patent and Trademark Office*